United States Patent
Tanaka (10) Patent No.: US 7,242,580 B1
(45) Date of Patent: Jul. 10, 2007

(54) DISK ARRAY APPARATUS

(75) Inventor: Shigeaki Tanaka, Odawara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/373,164

(22) Filed: Mar. 13, 2006

(30) Foreign Application Priority Data

Dec. 28, 2005 (JP) ............................. 2005-377138

(51) Int. Cl.
*H05K 7/20* (2006.01)
*H05K 5/00* (2006.01)
*H01L 35/28* (2006.01)

(52) U.S. Cl. .................. 361/696; 361/685; 361/724; 361/730; 454/184; 136/212

(58) Field of Classification Search ............... 361/676, 361/678–679, 685, 687–697, 724–727, 728–731, 361/700, 701–702, 704; 374/10–13; 62/3.2, 62/3.6, 3.7; 136/201, 205, 211–212; 165/104.21, 165/104.23–104.24; 312/223.2; 211/41.17; 454/184

See application file for complete search history.

(56) References Cited

U.S. PATENT DOCUMENTS

| | | | | |
|---|---|---|---|---|
| 5,419,780 A * | 5/1995 | Suski | .......................... | 136/205 |
| 6,143,975 A * | 11/2000 | Liao et al. | .................. | 136/201 |
| 6,215,660 B1 * | 4/2001 | Lin | ............................. | 361/695 |
| 6,246,579 B1 * | 6/2001 | Lin | ............................. | 361/695 |
| 6,289,678 B1 * | 9/2001 | Pandolfi | ........................ | 62/3.2 |
| 6,320,744 B1 * | 11/2001 | Sullivan et al. | ............. | 361/685 |
| 6,434,000 B1 * | 8/2002 | Pandolfi | ...................... | 361/685 |
| 6,480,380 B1 * | 11/2002 | French et al. | ............... | 361/690 |
| 6,717,808 B2 * | 4/2004 | Ueda et al. | .................. | 361/695 |
| 6,927,980 B2 * | 8/2005 | Fukuda et al. | .............. | 361/700 |
| 2001/0023591 A1 * | 9/2001 | Maeda et al. | .................. | 62/3.2 |
| 2004/0145869 A1 * | 7/2004 | Tanaka et al. | .............. | 361/695 |
| 2005/0039465 A1 * | 2/2005 | Welch | ........................... | 62/3.7 |

FOREIGN PATENT DOCUMENTS

| | | |
|---|---|---|
| JP | 2004-178557 | 6/2004 |
| JP | 2005-076584 | 3/2005 |

* cited by examiner

*Primary Examiner*—Jayprakash Gandhi
*Assistant Examiner*—Bradley H Thomas
(74) *Attorney, Agent, or Firm*—Antonelli, Terry, Stout & Kraus, LLP.

(57) ABSTRACT

An efficient exhausting and cooling structure in a disk array apparatus is provided. A HDD module mounted in a HDD box of the disk array apparatus includes, around a HDD, a thermoelectric device which converts heat of HDD into electric power by using temperature difference, a cooling fan automatically operated by power supply of the thermoelectric device, and an air duct which directs air flowing and exhausted from the cooling fan to a rear face side of the HDD module. The entire apparatus is cooled and air therein is exhausted by the operation of exhaust fan operated by main power supply of the apparatus provided in an upper part of the chassis and the automatic operation of the cooling fan of each HDD module.

14 Claims, 9 Drawing Sheets

DISK ARRAY APPARATUS

CROSS-REFERENCE TO RELATED APPLICATION

The present application claims priority from Japanese Patent Application No. JP 2005-377138 filed on Dec. 28, 2005, the content of which is hereby incorporated by reference into this application.

TECHNICAL FIELD OF THE INVENTION

The present invention relates to a technology for a disk array apparatus (also referred to as storage apparatus) having a function to control a storage device such as HDD (Hard Disk Drive). More particularly, it relates to an exhaust and cooling structure thereof.

BACKGROUND OF THE INVENTION

In a recent large-scale disk array apparatus, the density growth and the performance improvement associated with the space-saving have been developing. Accordingly, in order to solve the problem of the lifetime of a magnetic disk or the like due to the heat generated by the components themselves, the cooling system with a high-power exhaust fan mounted in an upper part of the disk array apparatus is employed.

The cooling structure primarily used in the conventional disk array apparatus will be described below. Air is taken through front and rear faces of a chassis, and the air is exhausted by an exhaust fan and through air holes provided in an upper part of the chassis via a central duct of the chassis, thereby air-cooling each part in the chassis. In this cooling structure, the heat generated from HDD is forcibly released by the high-power exhaust fan operated by the main power supply of the apparatus and provided in an upper part of the chassis.

Japanese Patent Application Laid-Open Publication No. 2004-178557 describes an example of a cooling structure in a disk array apparatus.

Japanese Patent Application Laid-Open Publication No. 2005-76584 describes the cooling utilizing a thermoelectric device in an automobile. In this technology, voltage transformation and the like are required for utilizing a thermoelectric device.

SUMMARY OF THE INVENTION

In the conventional technologies, the problems of the lifetime of the HDD and others and the performance degradation of hardware occur due to the increase in heat generation resulting from the density growth and the performance improvement. Furthermore, there are also the problems of noise generated by the cooling system using the high-power exhaust fan and increase in power consumption due to the high power.

The present invention is made in view of such problems described above, and an object of the present invention is to provide an efficient exhaust and cooling structure for solving the problems of lifetime of components (HDD and others) in a disk array apparatus. More specifically, the first object thereof is to provide a technology capable of improving the cooling efficiency and the function of the entire apparatus, and the second object thereof is to provide a technology capable of reducing the noise and power consumption of the cooling fan and the like.

The typical ones of the inventions disclosed in this application will be briefly described as follows. In order to achieve the objects described above, the present invention provides a technology for a disk array apparatus, in which a storage device such as HDD is connected in the form of a storage device module having a canister frame, and a function to control the storage device module is provided. Also, it is characterized by having the technological means described below.

In the disk array apparatus of the present invention, as a highly efficient cooling structure utilizing the heat generation and exhaust heat from a storage device such as HDD which is to be both the heating element and the component to be cooled, the following structure is provided for each unit of the storage device module. The storage device module is provided with thermoelectric conversion means which is disposed near the storage device and converts the heat from the storage device into electric power and cooling means using an exhaust fan automatically operated by the electric power of the thermoelectric conversion means without using the main power supply of the apparatus.

In particular, as the thermoelectric conversion means, a thermoelectric conversion device or element which generates power by the temperature difference between a high-temperature portion and a low-temperature portion thereof is provided, and as the cooling means, a cooling fan connected to the thermoelectric device and an air duct which supports the cooling and exhaust of the cooling fan are provided. By the operation of the fan and the air duct, the storage device and its surrounding are air-cooled, and the air is exhausted to the outside of the storage device module.

Also, the exhaust and the cooling in the entire disk array apparatus can be performed by the exhaust fan operated by the main power supply of the apparatus, which is the cooling and exhaust means disposed in an upper part of the chassis, and the automatic operation of the exhaust and air blower means in each unit of the storage device module. The components to be cooled (disk portion and the like) are forcibly cooled.

A high-temperature portion of the thermoelectric device is disposed near a heating element of the storage device (e.g., board portion on a side face), and a low-temperature portion of the thermoelectric device is disposed at a position on a ventilation path (e.g., front face of the storage device). Also, the air duct is disposed near the components to be cooled of the storage device (e.g., disk portion).

In the present disk array apparatus, air holes are provided in the front and rear faces and an upper face of the chassis, and storage device boxes are provided on the front and rear sides of the chassis and a rear board is provided on the rear side of the storage device box. Furthermore, a plurality of storage device modules are detachably mounted in the storage device box and to the rear board. The exhaust fan operated by the main power supply of the apparatus is provided in the upper part of the chassis. Air is taken from the front and rear faces of the chassis by the operation of the exhaust fan, and the air flows through the storage device modules and is exhausted to the rear side thereof, and then exhausted to the outside of the chassis through the exhaust fan in the upper part via the duct vertically extending in the central part of the chassis.

Also, in the present disk array apparatus, the temperature state near the storage devices and the data access and others to the storage devices are monitored and detected in a control board which controls the plurality of storage device modules, and the rotation of the upper exhaust fan is controlled based on the detected states. Furthermore, the plurality of storage device modules, the upper exhaust fan, the ventilation path and the like are grouped and managed based on each group, and the exhaust fan is controlled for each group.

The effects obtained by typical aspects of the present invention will be briefly described below. According to the present invention, an efficient exhaust and cooling structure capable of solving the problem of the lifetime of the components (HDD and others) in the disk array apparatus can be provided. In particular, first, it is possible to achieve the high cooling efficiency and cooling function in the entire apparatus. Second, it is possible to reduce the noise and the power consumption of the fan and others. Furthermore, it is possible to realize a simple and low-cost cooling system which can improve the degree of freedom of the design and mounting and can contribute to the downsizing of the apparatus.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted. FIG. 1 to FIG. 10 are diagrams for describing the embodiments of the present invention.

First Embodiment

In the first embodiment, in brief, a structure in which a thermoelectric device 23, a cooling fan 24, an air duct 25 and others are attached to a HDD module 20 (see FIG. 3) will be described. The components including HDD 200 are cooled by the cooling fan 24 connected to the thermoelectric device 23 and an electrically-operated exhaust fan 35 (operated by main power supply of the apparatus) in an upper part of the chassis. The thermoelectric device 23 generates electric power by the thermoelectric conversion of the heat generated from the HDD 200. The cooling fan 24 is automatically operated by the power of the thermoelectric device 23. The air duct 25 supports the exhaust by the cooling fan 24 and the cooling of the predetermined parts (disk portion 202) of the HDD 200.

Figure 1:
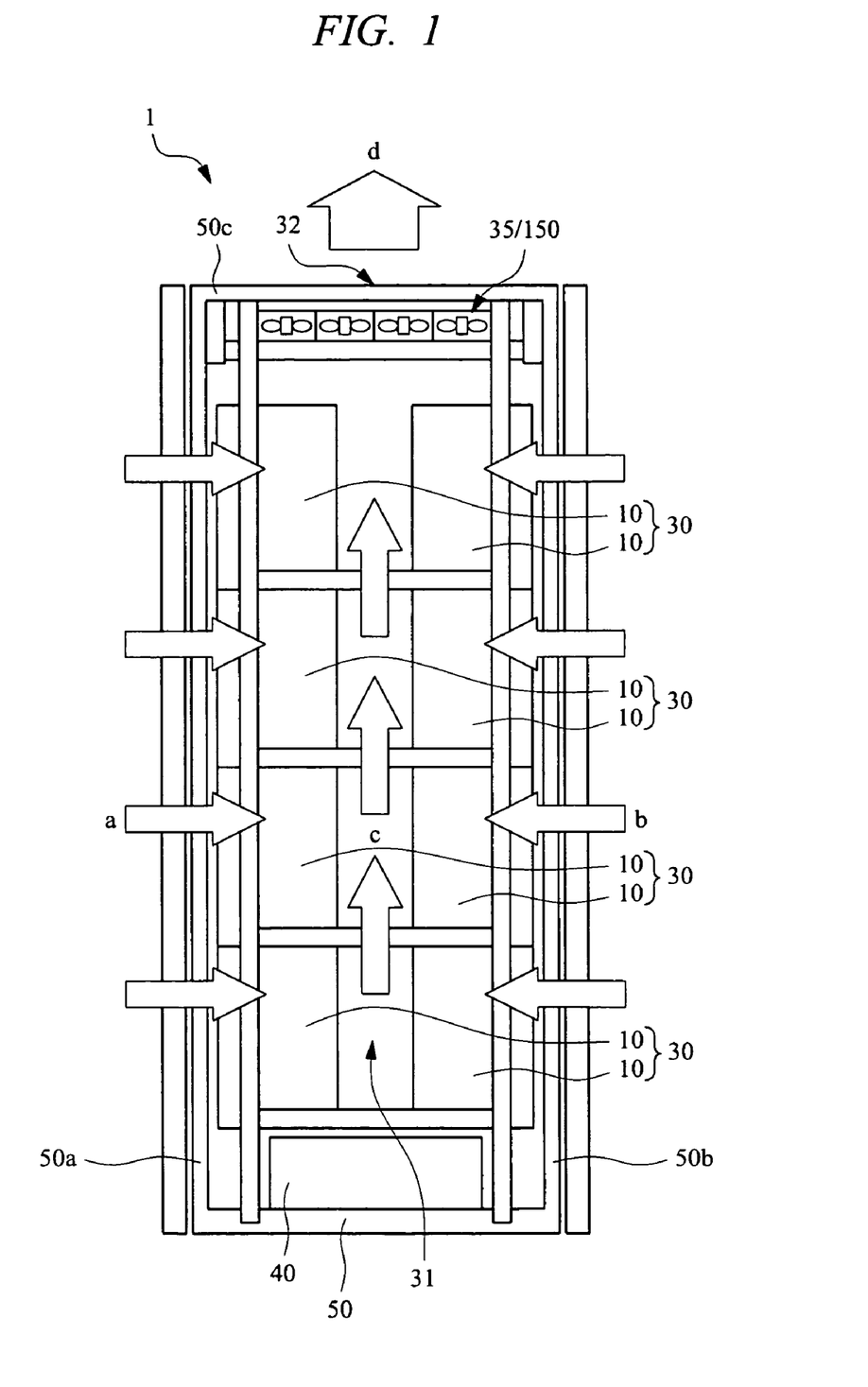
FIG. 1 is a diagram showing a disk array apparatus and an entire structure of a ventilation path seen from a side of a chassis according to a first embodiment of the present invention.
Figure 2:
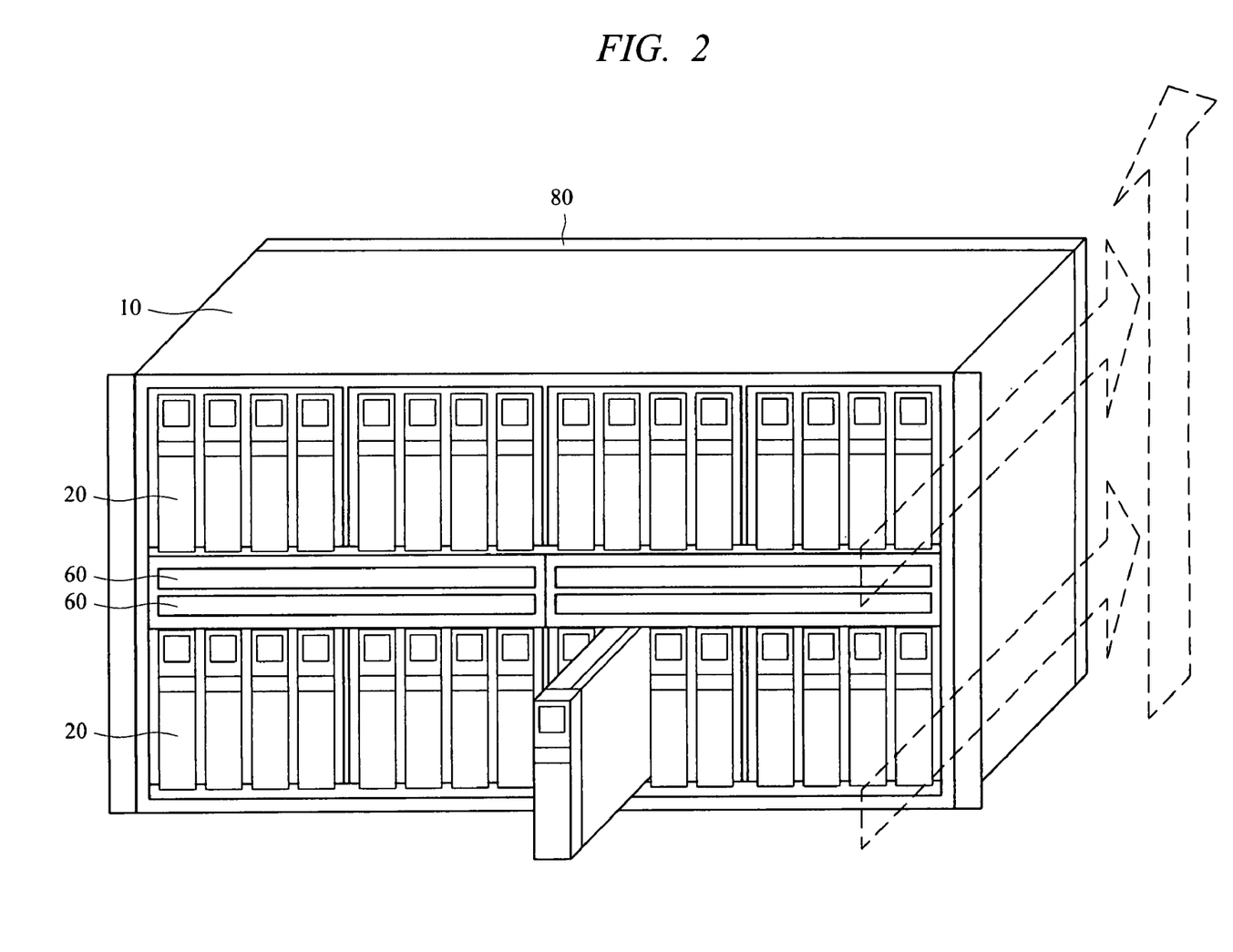
FIG. 2 is a diagram showing a structure of a HDD box seen from a front side in the disk array apparatus according to the first embodiment of the present invention.
Figure 3:
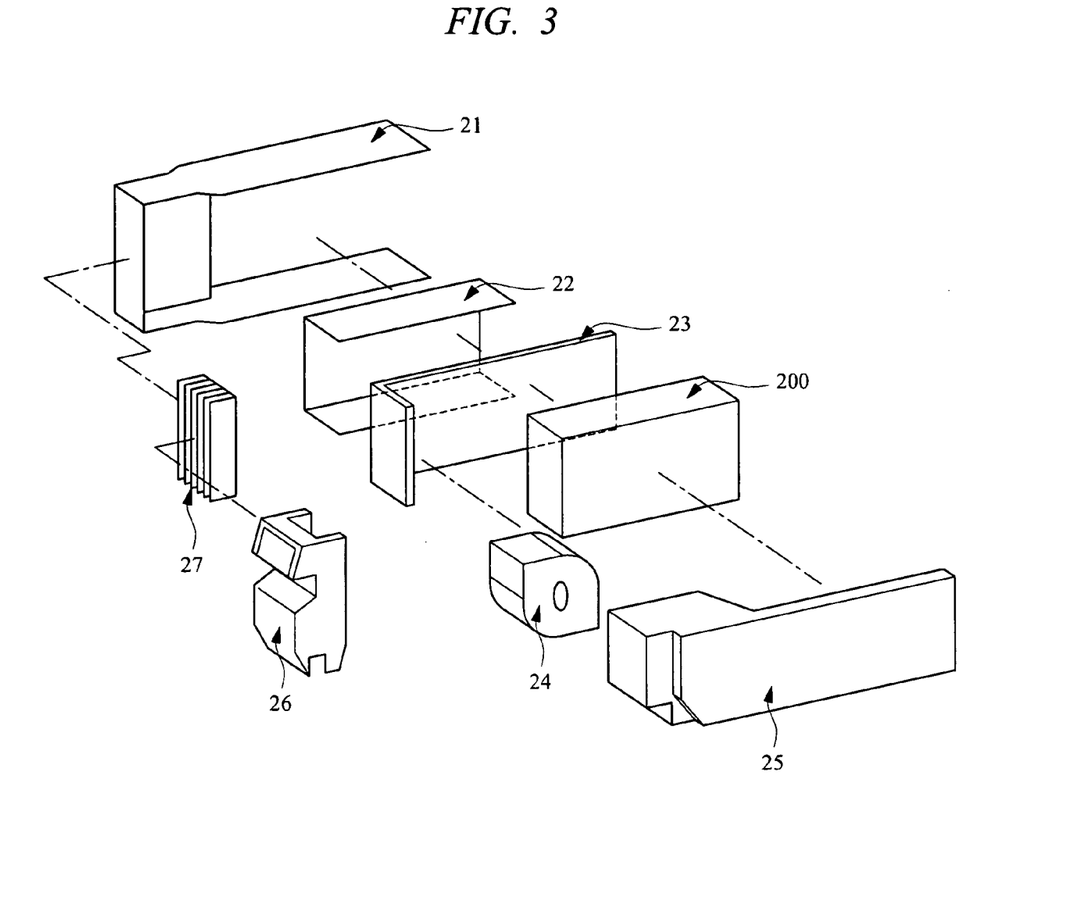
FIG. 3 is an exploded diagram showing an entire structure of a HDD module in the disk array apparatus according to the first embodiment of the present invention.
Figure 4:
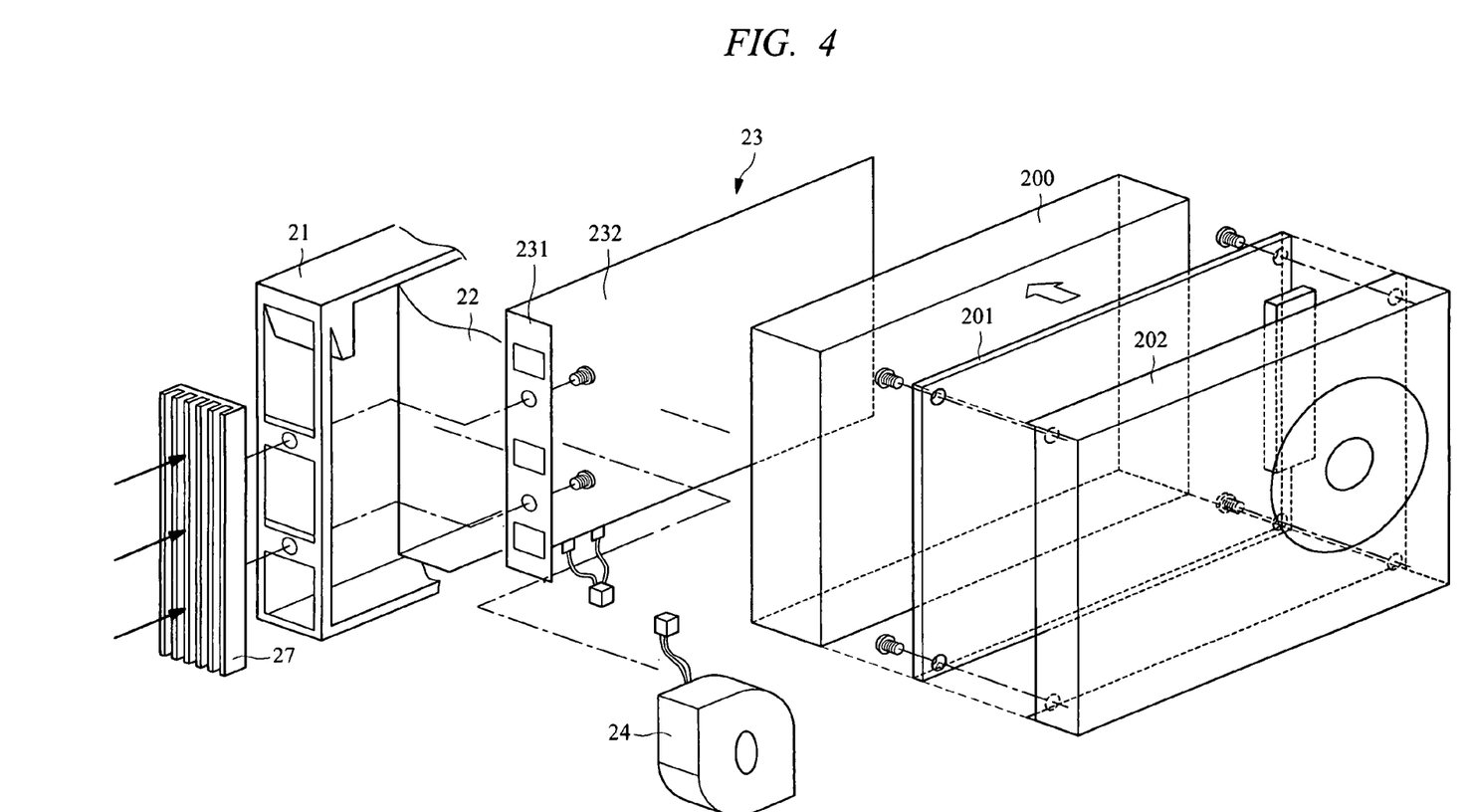
FIG. 4 is an exploded diagram showing a part of the HDD module, especially an internal structure of a HDD and an attachment of a thermoelectric device in the disk array apparatus according to the first embodiment of the present invention.
Figure 5:
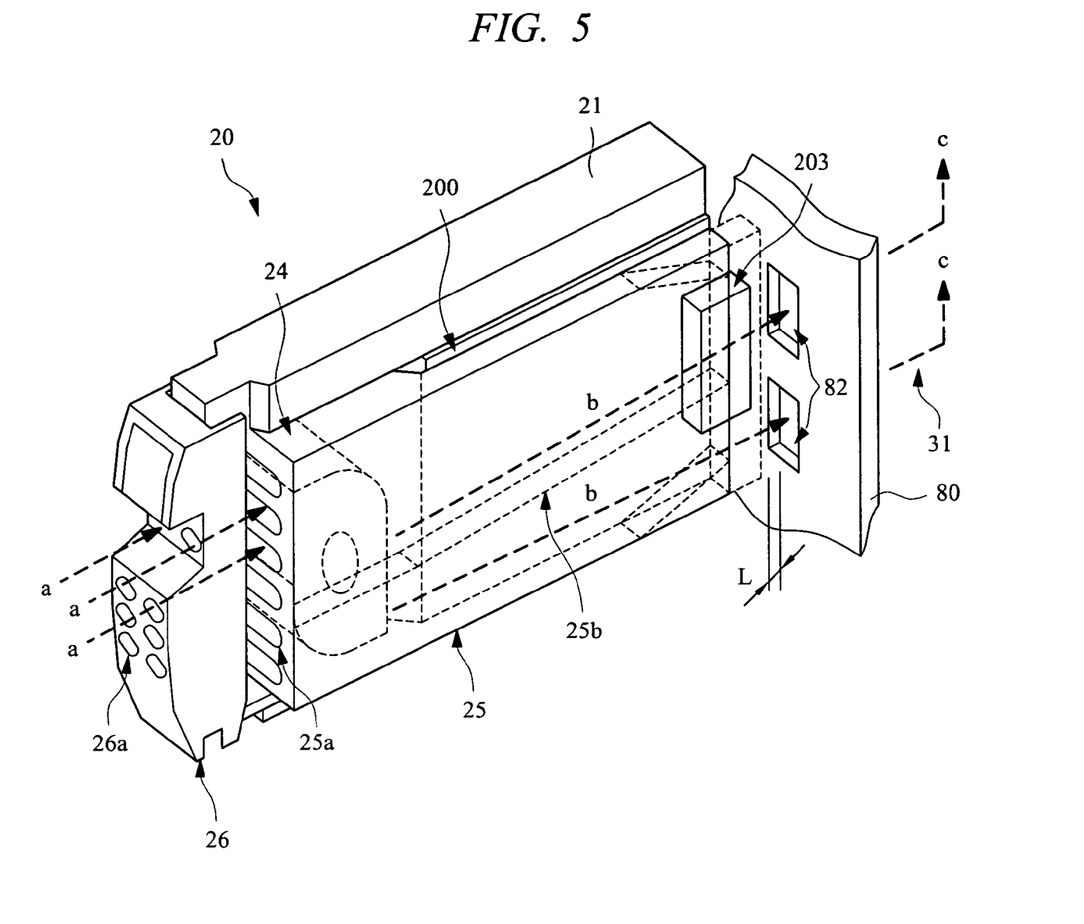
FIG. 5 is a diagram showing a structure of the assembled components integrated as the HDD module in the disk array apparatus according to the first embodiment of the present invention.
Figure 6:
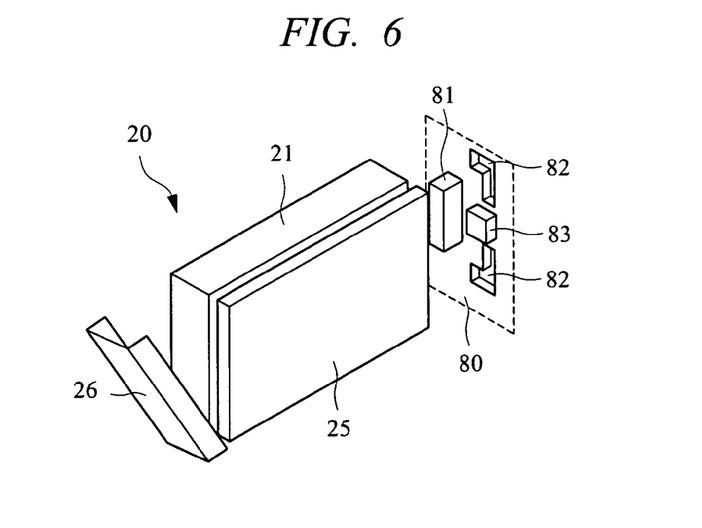
FIG. 6 is a schematic diagram showing the connection of the HDD module to a rear board in the disk array apparatus according to the first embodiment of the present invention.
Figure 7A:
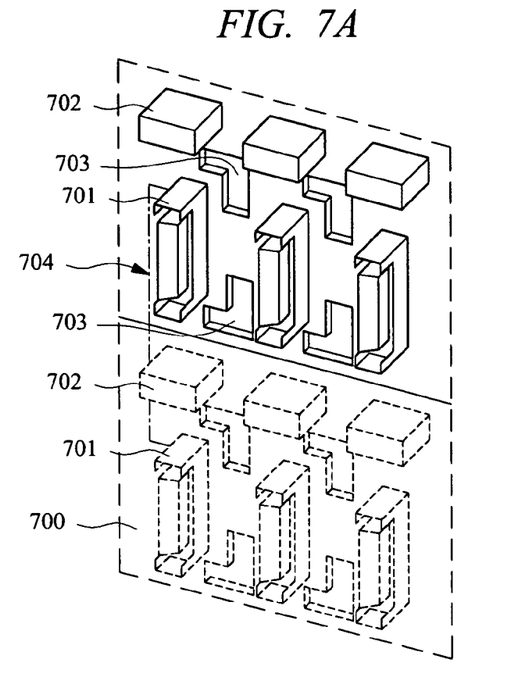
FIG. 7A is a diagram showing a structure of a rear board in a conventional technology, which is used for the comparison between a rear board in the disk array apparatus according to the first embodiment of the present invention and that in the conventional technology.
Figure 7B:
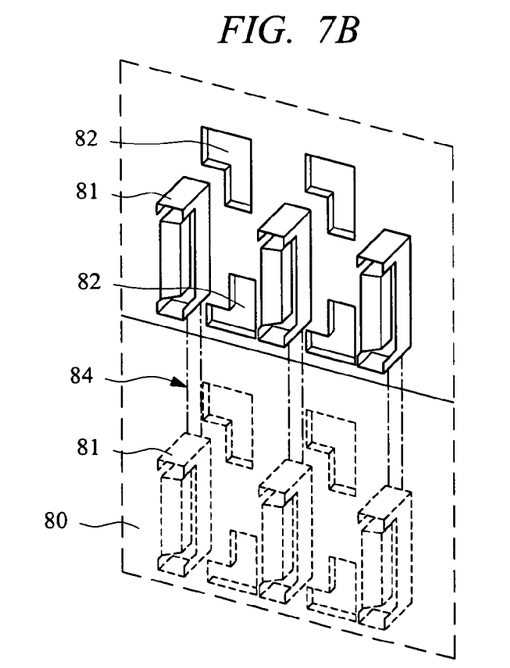
FIG. 7B is a diagram showing a structure of the rear board in the first embodiment of the present invention, which is used for the comparison between a rear board in the disk array apparatus according to the first embodiment of the present invention and that in the conventional technology.

FIG. 1 is a diagram showing a disk array apparatus 1 and an entire structure of the ventilation path seen from side of the chassis in the first embodiment of the present invention. FIG. 2 is a diagram showing the structure of one unit of the HDD box 10 in the disk array apparatus 1 seen from front side. FIG. 3 to FIG. 6 are diagrams showing the structure of the HDD module 20. FIG. 3 is an exploded diagram showing the entire structure of the HDD module 20. FIG. 4 is an exploded diagram showing the internal structure of the HDD 200 and the attachment of the thermoelectric device 23 as a part of the structure of the HDD module 20. FIG. 5 is a diagram showing the structure of the assembled components integrated as the HDD module 20. FIG. 6 is a schematic diagram showing the connection of the HDD module 20 to a rear board 80. FIG. 7 is a diagram for comparing the structure of the rear board 80 of the disk array apparatus 1 with that of the conventional technology.

<Basic Structure of the Apparatus>

The basic structure of the disk array apparatus 1 according to the first embodiment will be described with reference to FIG. 1 and FIG. 2. The apparatus 1 has units each composed of the HDD boxes (disk box) 10, upper exhaust fans 35, a lower power supply unit 40 and others in a frame (rack) 50. The chassis of the apparatus 1 is basically formed of a frame 50 with an almost rectangular parallelepiped shape, in which the HDD boxes 10 can be stored. The frame 50 has areas for air hole and openings which form the ventilation path of the entire apparatus 1 in its front face (50a), rear face (50b) and upper face (50c). Also, doors provided with a filter and the like are provided in the front and rear faces (50a and 50b) of the frame 50.

The apparatus 1 can mount a plurality of HDD boxes 10. Four HDD boxes 10 are vertically mounted respectively on the front and rear face sides (50a and 50b) in the apparatus 1. A plurality of HDD modules 20 can be stored and connected in each of the HDD boxes 10. The HDD box 10 supplies electric power from the power supply unit 40 to the HDD modules 20 stored therein. Two HDD boxes 10 are disposed on the front and rear face sides (50a and 50b) in the chassis, with the rear faces (exhaust face) thereof being opposite to each other and keeping some distance (serving as ventilation path and space) therebetween. These two HDD box 10 form a unit 30. Four units 30 are mounted in four stages in the chassis.

A power supply section (140) of the apparatus 1 is provided in a lower part of the apparatus, that is, below the lowermost unit 30. The power supply section (140) has a plurality of power supply units 40. The power supply unit 40 has an AC/DC power supply portion, a battery, and others. The DC power is supplied from the power supply unit 40 to each of the HDD boxes 10, the rear board 80, the upper exhaust fans 35 and others.

<Entire Ventilation Path>

As shown in FIG. 1, a central duct 31 is formed in the center of the apparatus 1. More specifically, the spaces between the HDD boxes 10 in the units 30 in each of the four stages are connected to form the central duct 31 which serves as a central ventilation and exhaust path (vertical direction) and a space of the apparatus 1. The central duct 31 is connected to ventilation paths (horizontal direction) extending from the HDD boxes 10 provided on the front and rear face sides (50a and 50b) and to an upper exhaust fan section (150).

In the upper part of the chassis, that is, on the uppermost unit 30, a plurality of exhaust fans 35, for example, total of eight fans 35 are provided as the exhaust fan section (150). The plurality of exhaust fans 35 are provided at the position close to the upper surfaces of the two HDD boxes 10 and the end of the central duct 31 over the entire upper face (50c) of the chassis. The exhaust holes (32) and the openings are formed in the upper face (50c).

The entire ventilation and exhaust path of the disk array apparatus 1 will be described below. Air is taken from the front and rear faces (50a and 50b) of the chassis by the normal operation of the exhaust fans 35 (a and b). The air passes through heating elements such as the HDD modules 20 in the HDD boxes 10 to the central duct 31, and flows upward in the central duct 31 (c). Then, the air is exhausted to the outside of the chassis through the exhaust fans 35 and the exhaust holes (32) in the upper part of the chassis (d). In this manner, the components in the chassis are air-cooled.

Cooling fans 24 which utilize the heat from the HDD 200 and are not operated by the main power supply of the apparatus are provided for the HDD module 20. Therefore, in broad terms, the exhaust and the cooling are performed by the combination of the automatic operation in each of the HDD modules 20 and the operation of the exhaust fans 35 in the upper part of the chassis in the entire apparatus 1.

<HDD Box and Rear Boards>

As shown in FIG. 2, a total of 32 HDD modules 20 can be detachably mounted and connected in the two upper and lower stages of the HDD box 10 from the front face (intake surface) thereof in units of the HDD module 20. Also, in addition to the HDD modules 20, a control board (HDD control board) 60 (different from the control system of the apparatus (DKC)) which controls the HDD modules 20 can be stored and connected in the HDD box 10. In the present embodiment, four control boards 60 each of which controls eight HDD modules 20 and corresponds to the FSW described later are mounted and connected as the control board 60 in the region between the upper and lower stages.

A rear board 80 (also referred to as HDD platter) is provided in the rear face of the HDD box 10. The HDD modules 20 and others are electrically connected to the rear board 80. The electric power is supplied from the power supply section (140) of the apparatus to the HDD modules 20 and the control boards 60 via the rear board 80.

As schematically shown by the arrows on the right side of FIG. 2, air is taken and ventilated from the front face to the rear face of the HDD box 10 through each of the HDD modules 20, and the air reaches the central duct 31 through the rear board 80 in the rear face of the HDD box 10. Then, the air flows into the upward flow in the central duct 31.

In the present embodiment, holes or openings for ventilation are formed in the front face of each HDD module 20. Alternatively, the structure in which the space between the HDD modules in the lateral direction forms a part of the intake surface is also preferable. The structure using the space between the HDD modules 20 in the lateral direction is the design in consideration of the arrangement in which a plurality of HDD modules 20 including such components as the thermoelectric device 23 and the air duct 25 are disposed next to each other.

The exterior of the HDD module 20, especially the upper and lower parts thereof, is designed so as to correspond to the mechanism provided in the HDD box 10 for inserting and holding the HDD module 20. For example, the HDD box 10 has a structure such as a guide rail for inserting the HDD module 20 therein, and the exterior of the HDD module 20 has a structure which engages with the guide rail or the like. Accordingly, when detaching the HDD module 20, the HDD module 20 is inserted from the corresponding position of the front face of the HDD box 10 and moved horizontally along the guide rail or the like, and then, an I/F connector 203 of the HDD 200 and a corresponding connector 81 of the rear board 80 are jointed in the back to connect the HDD module 20 to the HDD box 10. Similarly, when removing the HDD module 20, a handle 26 of the HDD module 20 is pulled from the corresponding position of the front face of the HDD box 10 to withdraw the HDD module 20 along the guide rail or the like, thereby disconnecting the HDD module 20.

As storage device modules to be mounted (connected) in the HDD box 10, a user can selectively mount the HDD modules 20 provided with cooling fans and the conventional modules not provided with them according to need. Accordingly, the cooling performance of the entire apparatus can be selected and adjusted in accordance with the required performance.

As shown in FIG. 6, the connector 81 corresponding to the I/F connector 203 of the HDD 200 and two exhaust holes (air hole) 82 corresponding to the ventilation surface of the air duct 25 are provided for each HDD module 20 in the rear board 80. The number and the shape of the exhaust holes 82 are not limited to these and various modifications can be made therein.

When the I/F connector 203 of the HDD 200 and the connector 81 are connected, the HDD module 20 is connected (installed) to the system of the apparatus 1. Furthermore, boards and units other than the control board 60 are also connected to the rear board 80 via connectors. The modules and the boards are mutually connected and the power is supplied therebetween through the wirings in the rear board 80. The HDD module 20 is connected to an upper control system or a host computer via the wirings in the rear board 80. The control system mentioned here is a DKC (disk controller) which controls the HDD 200 group and has the RAID control function. Also, the host computer is a computer which accesses the disk array apparatus 1 to use the storage area of the HDD 200.

<Policy of Cooling>

The policy of the cooling in the cooling structure of the disk array apparatus 1 will be described below. Of the various components in the chassis, the HDD modules 20 are the main (primary) objects to be cooled. The operating environmental temperature is different in a board portion 201 and a disk portion 202 of the HDD 200, and that of the board portion 201 is higher than that of the disk portion 202. More specifically, it is desired to sufficiently cool the disk portion 202 (especially spindle motor portion) when used. The operating environmental temperature mentioned here is the desired temperature in the environment where the object components are to be used or the temperature in which the normal operation thereof is ensured. For example, the operating environmental temperature of the disk array apparatus 1 is the constant temperature retained in the computer room, for example, 25 to 30° C.

Therefore, in the first embodiment, the disk portion 202 of the HDD module 20 having a low operating environmental temperature is the main object to be cooled by the cooling fan 24 provided in the HDD module 20. Also, the thermoelectric conversion device 23 particularly uses the heat generated from the board portion 201. In the conventional apparatus, air of about 2.0 m/s flows around the transportable magnetic device (HDD and module thereof), and the cooling fan 24 with the air volume of about 2.0 m/s is mounted also in the first embodiment. The air cooling is performed by the combination of the cooling fan 24 and the exhaust fan 35.

<HDD Module>

As shown in FIG. 3, the HDD module 20 has an integrated structure obtained by attaching various components to the HDD 200 to be a main component thereof. Also, as shown in FIG. 6, the HDD module 20 has an exterior with an almost rectangular parallelepiped shape composed of the frame 21, the air duct 25 and the handle 26, and it is mounted in the space with a corresponding shape in the HDD box 10. The HDD module 200 of the HDD module 20 has the I/F connector 203 on the rear side as shown in FIG. 5 and is connected to the connector 81 at a corresponding position on the rear board 80 (shown partly). The connector 81 and exhaust holes 82 are formed as a set in the rear board 80, and the rear board 80 corresponds to the ventilation surface of the air duct 25. In the present embodiment, two exhaust holes 82 are provided for one HDD module 20. Also, a temperature sensor 83 and the like for detecting the temperature can be provided near the exhaust hole 82 (described later).

In FIG. 3, the HDD module 20 includes, from the back side (left side of the HDD module 20) to the front side (right side of the HDD module 20), the frame (canister frame) 21, a bracket (mounting fitting) 22, the thermoelectric device (also referred to as thermoelectric conversion device) 23, the HDD 200, the cooling fan 24, and the air duct 25. Also, the HDD module 20 also includes, from the front side of the HDD module 20, the handle 26, a cooling fin 27, a base portion of the frame 21, a front portion of the thermoelectric device 23, a front portion of the air duct 25, the cooling fan 24, the HDD 200 and others. The cooling fan 24 is disposed between the front portion of the thermoelectric device 23 and the front face of the HDD 200. The cooling fin 27 is disposed so as to be contained in the handle 26. The cooling fan 24 is stored in the front portion of the air duct 25.

In FIG. 4, the HDD 200 is mainly composed of a board portion (also referred to as control device) 201 and a disk portion 202. The board portion 201 is fixed to the disk portion 202 by screws. In the present embodiment, although the HDD 200 has an almost rectangular parallelepiped shape, the HDD having other shape is also available. In such a case, the frame 21 and others have the shape corresponding to it.

Circuit IC and others for controlling the drive of the disk portion 202 are mounted in the board portion 201. The disk portion 202 has hardware such as the spindle motor for driving the magnetic disk.

The operating environmental temperature of the disk portion 202 (especially spindle motor thereof) is, for example, "the operating environmental temperature of the disk array apparatus+12° C.". The board portion 201 has the operating environmental temperature of, for example, 100° C. or lower.

The HDD 200 is attached to or provided near the thermoelectric device 23. The bracket 22 is attached to the frame 21, and the thermoelectric device 23 is attached to the bracket 22. The front portion (low-temperature portion 231) of the thermoelectric device 23, the front portion of the frame 21, and the cooling fin 27 are fixed by screws. The front portion (low-temperature portion 231) of the thermoelectric device 23 is cooled by the incoming external air (room temperature: 25 to 30° C.) and temperature thereof is reduced. On the other hand, the temperature of the side portion (high-temperature portion 232) of the thermoelectric device 23 is increased by the heat absorption from the board portion 201.

It is necessary to electrically connect the thermoelectric device 23 and the cooling fan 24. In this connection structure, for example, conductive wires extend from two (+/−) terminals of the thermoelectric device 23 to form a connector, and the connector and a connector of the cooling fan 24 are connected. The electric power generated by the temperature difference between the low-temperature portion 231 and the high-temperature portion 232 of the thermoelectric device 23 is supplied to the cooling fan 24 via the above-mentioned terminals. The cooling fan 24 is automatically operated by this power supply.

More specifically, when the temperature difference in the thermoelectric device 23 is large (when heat generated from the HDD 200 is high), the air flow from the cooling fan 24 is increased by that much. Also, when the temperature difference is little (when heat generated from HDD 200 is low), the air flow is automatically stopped. In comparison with the case where the ventilation fans operated by the main power supply of the apparatus and provided in each of the HDDs are uniformly operated to send air, the efficient cooling in accordance with the heating state of the HDDs 200 can be performed.

In FIG. 4, the thermoelectric device 23 has a low-temperature portion (front portion) 231 and a high-temperature portion (side portion) 232 therein, and is made of a material which generates an electric power by the temperature difference. In the thermoelectric device 23, the phenomenon that the temperature difference between the two portions (231 and 232) causes the potential difference to generate electrons is utilized for the self power generation (thermoelectric conversion). The thermoelectric device 23 is made of, for example, La (lanthanum)—Fe (iron)—Sb (antimony) series alloy.

In the present embodiment, according to the policy of cooling described above, the high-temperature portion 232 is disposed on the side face of the board portion 201 of the HDD module 20, and the low-temperature portion 231 is disposed on the front face of the HDD module 20. Also, the side portion of the air duct 25 is disposed on the side face of the disk portion 202 of the HDD module 20.

The low-temperature portion 231 of the thermoelectric device 23 is cooled by the air taken from the front side of the HDD module 20 and the temperature thereof is decreased. Simultaneously, the high-temperature portion 232 of the thermoelectric device 23 absorbs heat from circuit IC components of the board portion 201 of the HDD module 20 or the cover of the HDD 200 (part provided between the board portion 201 and the thermoelectric device 23) and the temperature thereof is increased.

The thermoelectric device 23 has a L shape composed of two plates (to be the low-temperature portion 231 and the high-temperature portion 232, respectively) in the present embodiment. However, the shape is not limited to this, and various modified shapes can be used as long as the portions having relatively high and low temperatures can be secured. For example, when the front face (low-temperature portion 231) is modified to have a bent shape instead of a flat shape so as to increase the area thereof, the power generation efficiency can be increased.

The bracket 22 has a function to attach the HDD 200 and the frame 21 and to protect the board surface. However, it is not always necessary to provide the bracket 22, and the bracket 22 can be integrated with the frame 21. The handle 26 has a function to support the insertion and removal operation of the HDD module 20. However, it is not always necessary to provide the handle 26, and the handle 26 can be integrated with the frame 21. The cooling fin 27 is a heat conductive component (radiation member), and it mainly supports the cooling of the low-temperature portion 231 (front face) of the thermoelectric device 23. However, it is not always necessary to provide the cooling fin 27.

The ventilation path in the HDD module 20 will be described with reference to FIG. 5. Basically, the external air is taken from the front side of the HDD module 20 by the operation of the exhaust fans 35 in the upper part of the chassis. First, the air is taken through the handle 26, the cooling fin 27, the front portion of the frame 21, and the front portion (231) of the thermoelectric device 23 (a). By doing so, the low-temperature portion 231 of the thermoelectric device 23 provided near the cooling fin 27 and the front portion of frame 21 is cooled. The wind by this intake air is directed from the interior of the air duct 25 to the rear side by using the operation of the cooling fan 24 in the air duct 25. By doing so, especially the disk portion 202 of the HDD 200 is cooled (b). Thereafter, the air is exhausted to the central duct 31 through the exhaust hole of the air duct 25 and the exhaust hole 82 of the rear board 80, and then exhausted toward the upper exhaust fan 35 through the central duct 31 (c).

Also, in the present embodiment, as shown by the dashed lines, partitions 25b are provided in the air duct 25 so that two ventilation paths corresponding to the position and the shape of the two exhaust holes 82 of the rear board 80 are formed. By doing so, the exhaust efficiency is improved. Also, the clearance (length L) between the air duct 25 and the rear board 80 in the state where the HDD module 20 is attached in the HDD box 10 and to the rear board 80 is reduced as short as possible. By doing so, since the amount of the exhaust air from the cooling fan 24 left in the HDD box 10 is reduced, the exhaust efficiency to the outside of the HDD box 10 (to the central duct 31) can be improved.

The components along the ventilation path, that is, the handle 26, the cooling fin 27, the frame 21, the thermoelectric device 23, and the air duct 25 have air holes or openings for passing air from the front face of the HDD module 20 to the cooling fan 24 on their front sides. For example, the handle 26 has a long hole 26a, and the air duct 25 has a long hole 25a. Also, in FIG. 4, openings are formed in the front portion of the frame 21 and in the front portion (low-temperature portion 231) of the thermoelectric device 23. Also, in the cooling fin 27, the air holes (not shown) are formed between a plurality of fins.

The reliability and the cooling efficiency of the present disk array apparatus 1 will be described. Under the condition that the external temperature (room temperature) of the apparatus 1 is constant, the case where the exhaust fan 35 in the upper part of the apparatus 1 is stopped due to some trouble is assumed. In such a case, the heat generated from the HDD 200. and the temperature of the HDD 200 are increased. However, if the external temperature is constant, the temperature difference occurs between the external temperature and the HDD 200. Therefore, based on the temperature difference, the more efficient cooling than usual by the self power generation can be performed by the thermoelectric device 23 and the cooling fan built in the HDD module 20. Accordingly, even when the exhaust fan 35 is stopped, the decrease in the cooling efficiency in the entire disk array apparatus 1 can be suppressed.

<Effect>

According to the first embodiment, the automatic cooling and exhaust support in accordance with the heat generated from the HDD 200 are performed by the thermoelectric device 23, the cooling fan 24, and the air duct 25 provided for each HDD module 20. Accordingly, different from the conventional technology, it is not necessary to forcibly exhaust the heat generated from the HDD 200 disposed relatively apart from the exhaust fan in the upper part of the chassis. In other words, in the present embodiment, the necessity of using a high-power (high-output) exhaust fan as the exhaust fan 35 in the upper part of the chassis is reduced.

Also, as the cooling structure using the thermoelectric device 23, the cooling and exhaust structure in which the portion to be cooled is limited to the disk portion 202 by using the air duct 25 is newly employed. Accordingly, the disk portion 202 for which the cooling is especially required can be forcibly cooled.

In addition, the conventional technology for cooling the circuit IC (board) by the mounted fans in a standard personal computer is well-known. In the disk array apparatus, since the operating environmental temperature of the HDD has to be lowered by its nature, the exhaust fan is directly attached to the HDD to cool it. In such a structure, power supply means for the exhaust fan has to be installed. As a result, various problems, for example, increase in both the power consumption and the cost will occur. Meanwhile, in the present embodiment, the electric power required for the cooling is supplied by the self generation of the thermoelectric device 23, and the installation of power supply connector and others for the power supply from the apparatus is not necessary.

In particular, in the curved part of the ventilation path, that is, in the part where the air flows upward from the back of the HDD boxes 10 on the front and rear faces (50a and 50b) through the central duct 31, the efficiency loss is relatively large and there is a room for improvement of the efficiency in the conventional technology. However, in the present embodiment, the loss can be solved by the installation of the cooling fan 24.

Consequently, it is possible to achieve both the highly efficient cooling and the reduction in noise and power consumption of the fan operation in the overall apparatus. In addition, owing to the low-cost cooling structure and the removal of the power supply connector and others, the structure of the apparatus can be simplified.

<Degree of Freedom of Design and Mounting>

The simplification of the structure of the apparatus as an effect of the present embodiment, in other words, the high degree of freedom of the design and mounting will be described as a supplementary explanation. In the case where the structure in which a conventional fan operated by the main power supply of the apparatus is provided to the HDD module is assumed as one solution, a power supply connector for the power supply from the apparatus has to be provided for the HDD module and the rear board. In such a case, the degree of freedom is low because the restriction on the design and mounting is given to the signal wiring patterns in the rear board. More specifically, the space for the power supply connector is required, and the signal wiring pattern must be formed away from the space. Meanwhile, in the first embodiment, it is not necessary to provide the power supply connector. Therefore, the restriction on the signal wiring pattern is reduced, and the space for forming the exhaust hole 32 and others can be increased. As a result, the degree of freedom of the design and mounting can be improved.

FIG. 7A and FIG. 7B are diagram of the examples of the mounting structure of the rear board 80, showing the effect described above. FIG. 7A is a diagram showing the conventional structure in which the power supply connector for the power supply to the fan is provided, and FIG. 7B is a diagram showing the structure according to the first embodiment, in which it is not necessary to provide the power supply connector.

In FIG. 7A, a rear board 700 (shown partly) has a connector 701, a PS (power supply) connector 702, a exhaust hole 703, and a signal wiring pattern 704 formed at corresponding positions of each HDD module. The connector 701 is connected to an I/F connector on the side of the HDD module. The PS connector 702 is connected to a PS connector on the side of the HDD module. The signal wiring pattern 704 is, for example, the signal wiring pattern between the corresponding connectors 701 in the upper and lower stages of the HDD box, and the signal wiring pattern 704 is bent so as to avoid the PS connector 702. As a result, a large space is required, which leads to the size increase of the apparatus. Also, due to the presence of the PS connector 702, the restriction is given to the size of the exhaust hole 703, and a high-power fan has to be installed in order to cover it. As a result, the problem of the noise and power consumption increase will occur. Also, since two types of connectors must be mounted also on the side of the HDD module, the connection structure with the rear board 80 becomes complex.

Meanwhile, in FIG. 7B, a rear board 80 (shown partly) has a connector 81 connected to the I/F connector 203, the exhaust hole 82 corresponding to the air duct 25, and a signal wiring pattern 84 formed at corresponding positions of each HDD module 20. The signal wiring pattern 84 is, for example, the signal wiring pattern between the corresponding connectors 81 in the upper and lower stages of the HDD box 10, and the signal wiring pattern 84 is linearly laid because the PS connector 702 and the like are not provided. In the case of FIG. 7B, other components can be mounted instead of the PS connector 702, and the signal wiring pattern 84 is short, readily laid and simplified. In addition, it is also possible to increase the size and the number of the exhaust holes 82 so as to improve the ventilation efficiency. As a result, the care required when installing the high-power fan becomes unnecessary, and the noise and power consumption can be reduced.

Second Embodiment

Figure 8:
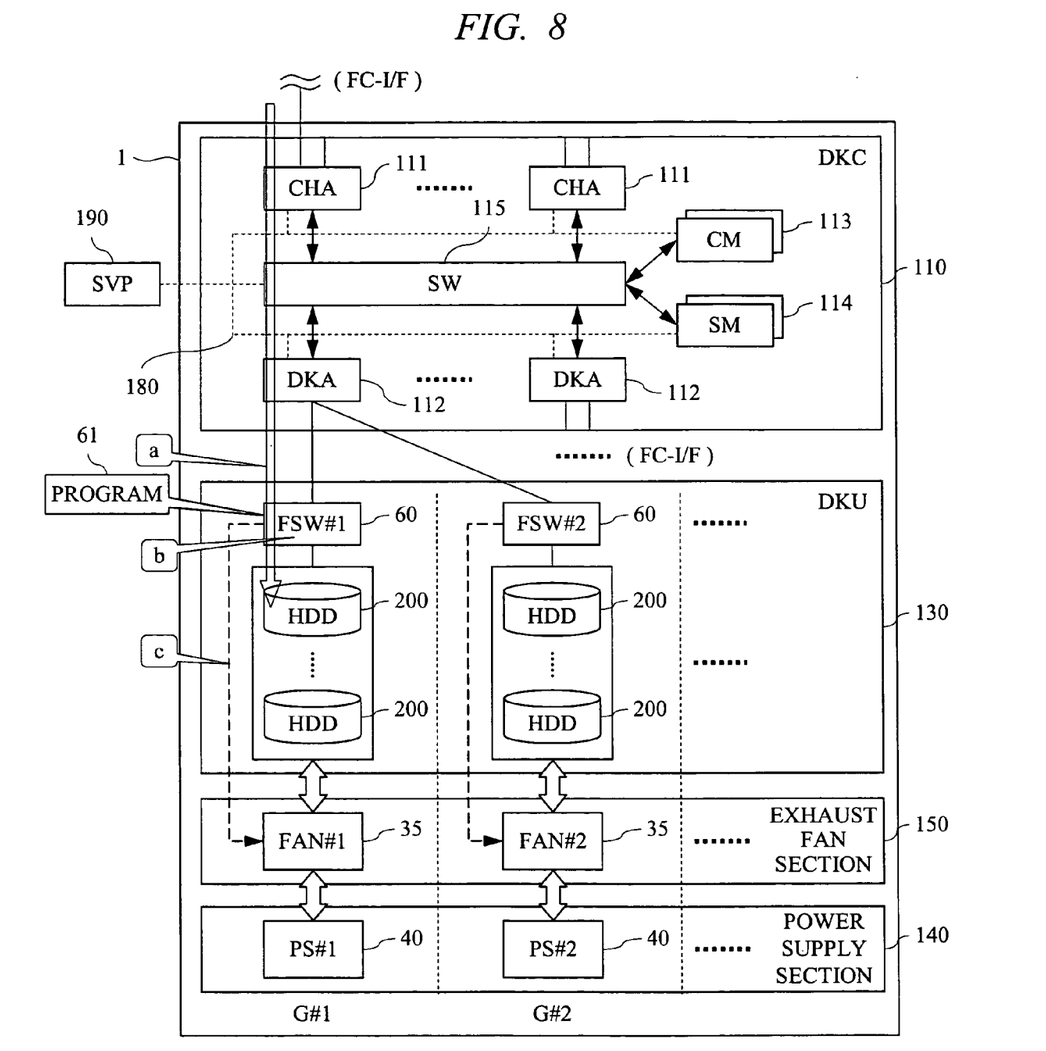
FIG. 8 is a diagram showing the configuration having an exhaust fan control function in a disk array apparatus according to second and third embodiments of the present invention.
Figure 9:
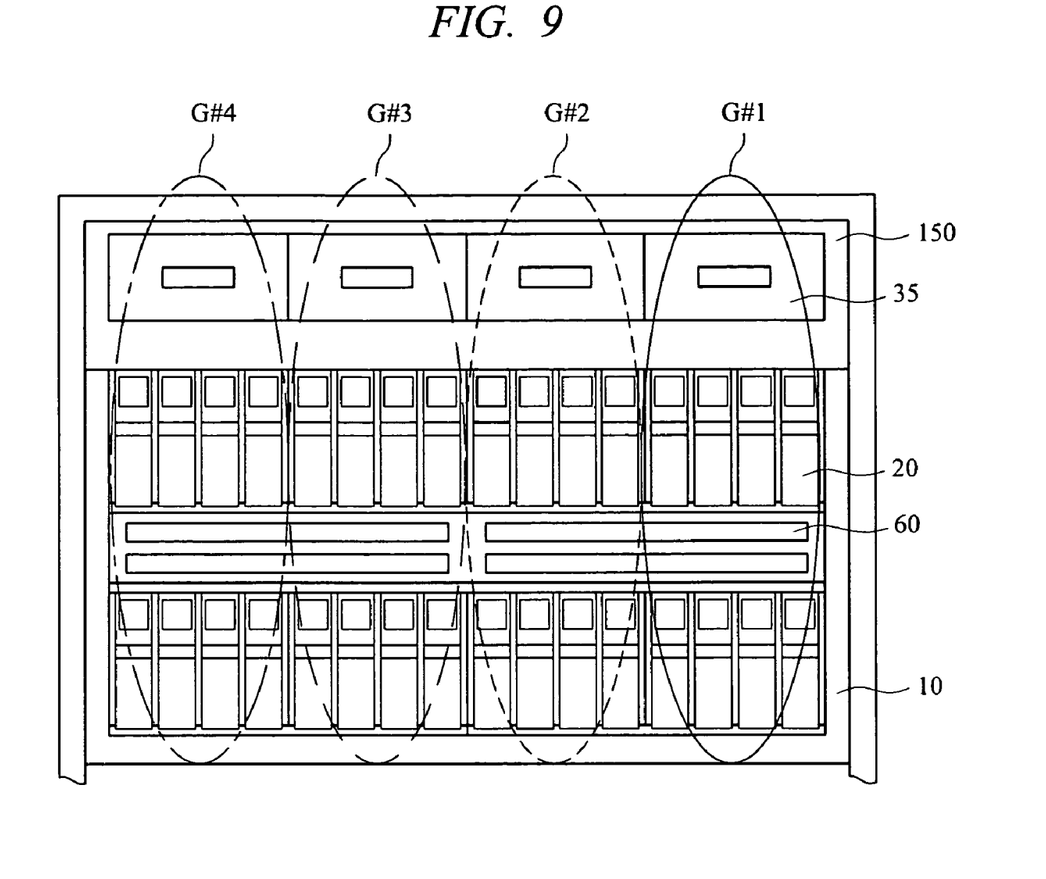
FIG. 9 is a diagram showing an example of the grouped structure of the HDD boxes and others in the disk array apparatus according to second to fourth embodiments of the present invention.

Next, the second embodiment will be described. FIG. 8 shows the configuration of the disk array apparatus 1 according to the second embodiment, in which an exhaust fan control function is provided. FIG. 9 shows an example of the grouped structure in the HDD boxes 10 and others. In the first embodiment, the control system (DKC) of the disk array apparatus 1 does not have to perform the particular control (software process) for the above-described cooling structure, and the effects can be achieved automatically. The second embodiment has the basic structure similar to that of the first embodiment, and the control (software process) for the above-described cooling structure is performed. In particular, the function to control the exhaust fan section (150) in the upper part of the apparatus based on the temperature state of the HDD 200 (HDD module 20) is provided. Also, the control function corresponding to the grouped structure is provided.

In the second embodiment, the control function for the exhaust fan 35 is provided so as to deal with the case where the cooling by the cooling fan 24 built in the HDD module 20 cannot be performed due to the unstable power supply and the case where the cooling fan 24 is stopped due to the trouble. When the function of the cooling fan 24 is degraded or the cooling fan 24 is stopped, the atmospheric temperature around the HDD module 20 is increased. As shown in FIG. 6, the temperature sensor (or thermostat) 83 is provided on the ventilation path and near the HDD module 20, in particular, near the exhaust holes 82 of the rear board 80, and the atmospheric temperature of the HDD module 20 is detected by the temperature sensor 83. Then, the temperature detected by the temperature sensor 83 is compared with a threshold value in a predetermined control processor. When the detected temperature exceeds the threshold value, the voltage applied to the exhaust fan 35 placed at the position corresponding to the concerned HDD module 20 of the upper exhaust fan section (150) is varied so as to increase the rotation speed of the fan. With such a control, the degradation of the cooling function for the HDD module 20 can be compensated.

As the structure thereof, for example, the temperature sensor 83 is connected to a control board 60 (FSW). The temperature detected by the temperature sensor 83 is compared with a threshold value and checked in the control board 60, and it is determined whether the exhaust fan 35 is controlled or not. Also, the structure is formed so that the voltage or the rotation speed of the upper exhaust fan 35 can be controlled by the control board 60. The threshold value is, for example, "operating environmental temperature+12° C.".

Also, although it is possible to collectively control all of the exhaust fans 35 mounted in the disk array apparatus 1, the structure in which the exhaust fans 35 can be selectively controlled is more effective when a plurality of exhaust fans 35 are mounted in the exhaust fan section (150). More specifically, the exhaust fan 35 corresponding to the location at which the HDD module 20 (or a group including it) having the trouble of the temperature state is mounted, selected and controlled.

For example, as shown in FIG. 9, in the apparatus 1, a plurality of HDD modules 20, the control boards 60 (FSW), and the exhaust fans 35 are grouped, and the apparatus 1 is controlled based on the groups. For example, groups G#1 to G#4 are shown, and the control of the exhaust fan 35 is performed in each of the groups. The upper exhaust fan section (150) and underlying one HDD box 10 on the front and rear faces (50a and 50b) of the apparatus are shown as an example. The same is equally true of other HDD boxes 10. As described by the four groups G#1 to G#4, one group is composed of a plurality of (eight) HDD modules 20, the control boards 60, and the exhaust fans 35.

For example, in the group G#1, the air taken from the front side of the eight HDDs 200 is exhausted mainly by the corresponding exhaust fan 35 (FAN#1) in the group G#1 through the central duct 31. Therefore, in the corresponding control board 60 (FSW#1), when the degradation of the cooling function is detected based on the temperature detected by the temperature sensor 83 disposed so as to correspond to the group G#1, the control for increasing the rotation speed of the corresponding exhaust fan 35 (FAN#1) is performed.

In the functional block configuration shown in FIG. 8, the disk array apparatus 1 has a structure in which the DKC 110 which is the control system of the apparatus and the DKU (disk unit) 130 corresponding to the unit 30 are connected. Further, a SVP (service processor) 190 for maintenance and management is connected to the DKC 110 via the internal LAN 180. Also, the apparatus 1 has the exhaust fan section 150 including a plurality of exhaust fans (FAN) 35 and a power supply section 140 including a plurality of power supply units (PS) 40. In each of the groups (G#1, G#2, . . . ), the exhaust fan 35 and the HDD 200 (HDD module 20) group are operated by the power supply of the corresponding power supply module 40.

The DKC 110 has processors for each function such as a CHA 111, a DKA 112, a CM 113, a SM 114, a SW 115 and others. The CHA 111 has a communication I/F (for example, FC (fiber channel)-I/F) and a control function to external devices such as a host computer. The DKA 112 has a communication I/F (for example, FC-I/F) and a control function to the HDD 200. The DKA 112 is connected to a plurality of control boards (FSW) 60 and can control the control boards 60. The CM 113 is a common cache memory, in which the data and others to the HDD 200 are stored. The SM 114 is a common memory, in which control information, configuration management information and others are stored. The SVP 190 is a computer, which has a maintenance and management function of the disk array apparatus 1 to perform the configuration management and the failure management. Also, an operator can perform the various maintenance and management processes by operating the SVP 190.

Note that the DKC 110 can have various mounting structures. For example, similar to the HDD box 10 and the DKU 130, the DKC 110 can have a structure that board modules corresponding to respective processors are stored and connected in a box (logic box). More specifically, it is possible to dispose the logic box or the board module instead of the HDD box 10 at the position thereof in the chassis. However, in the present embodiment, the DKC 110 is not the primary object to be cooled in this cooling structure, the detail description of the structure thereof is omitted.

The control board 60 controls a plurality of (for example, eight) HDDs 200. The control board 60 is provided with a program 61 for this control and executes the program to control the above-mentioned exhaust fan 35 through the software process. As a result of the process by the program 61, the process corresponding to the control function to the exhaust fan section (150) is performed. More specifically, the temperature detected by the temperature sensor 83 is compared with a threshold value and checked, and it is determined whether the exhaust fan 35 at a corresponding position is controlled or not, and then, the rotation speed or the like of the fan is controlled based on the determination. The direct control of the target exhaust fan 35 or the control of the input voltage to the target exhaust fan 35 from the corresponding PS 40 is carried out.

According to the second embodiment, by the control function for the exhaust fan section (150), especially by the control function corresponding to the grouped structure, the efficient cooling function in accordance with the temperature state of the HDDs 200 can be performed.

Third Embodiment

Next, the third embodiment will be described. The third embodiment basically has the structure similar to that shown in FIG. 8, and the control function for the upper exhaust fan 35 in consideration of the data access to the HDD 200 is provided. Furthermore, the control function corresponding to the grouped structure can be provided also in the third embodiment.

It is known that the temperature around the HDD 200 is increased by 0.5 to 1° C. by a unit data access such as the disk R/W access to the HDD 200 of the HDD module 20. In the third embodiment, the data access to the HDD 200 is monitored and detected by a predetermined control processor, and the rotation speed of the exhaust fan 35 corresponding to the location of the corresponding HDD module 20 is controlled to compensate the cooling by the cooling fan 24 built in the HDD module 20.

For example, as shown in FIG. 8, in the process by the program 61, the access to the HDD 200 is monitored and detected in the control board 60. For example, a predetermined HDD 200 and the group thereof in the DKU 130 are accessed (disk read (R)/write (W) access and the like) from a host computer or the like connected to the DKC 110 via the CHA 111, the SW 115 and the DKA 112 in the DKC 110 and the control board 60 (a). The access to the group G#1 is shown as an example. In the control board 60, such an access is monitored and detected (b). Then, when the access to the HDD 200 in its own group is detected, the voltage of the corresponding exhaust fan 35 in the group is varied by the control board 60 based on the period and the number of times of the data access so as to slightly increase the rotation speed of the fan (c).

According to the third embodiment, by the control function for the exhaust fan 35, the efficient cooling function in accordance with the data access state to the HDD 200 can be realized.

Fourth Embodiment

Figure 10A:
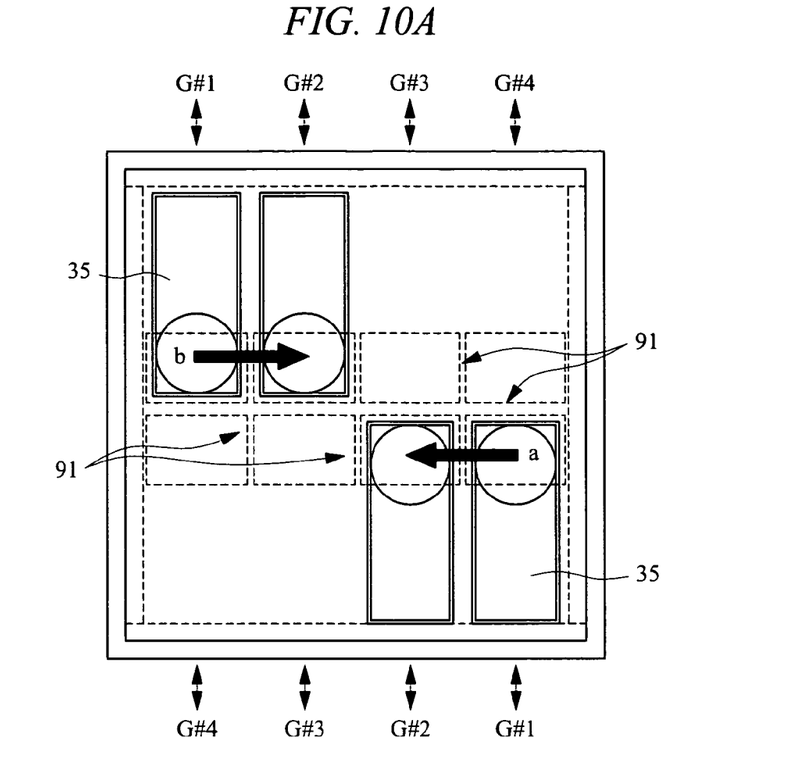
FIG. 10A is a diagram showing an example of a structure in which the ventilation path is divided into several paths so as to correspond to the grouped structure in the HDD box and the exhaust fan section in the disk array apparatus according to the fourth embodiment of the present invention.
Figure 10B:
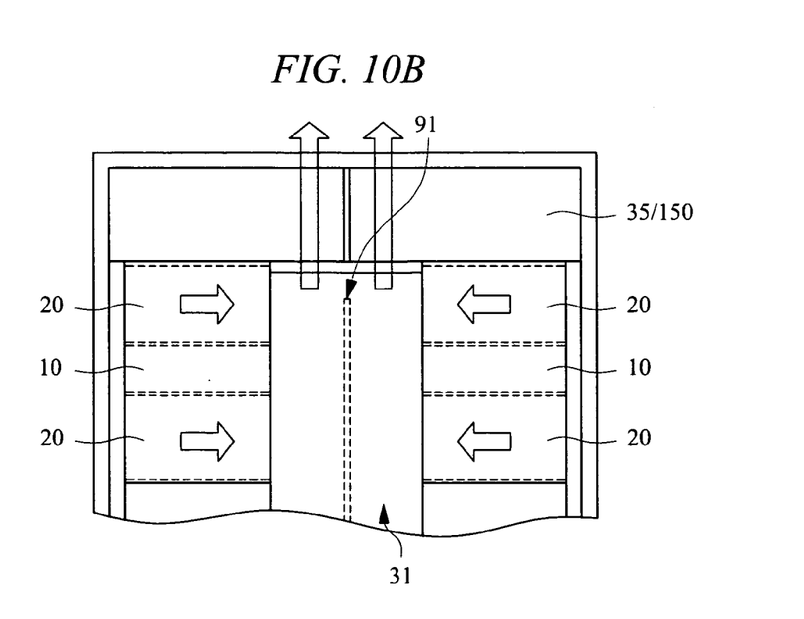
FIG. 10B is a diagram showing an example of a structure in which the ventilation path is divided into several paths so as to correspond to the grouped structure in the HDD box and the exhaust fan section in the disk array apparatus according to the fourth embodiment of the present invention.

FIG. 10 shows an example of a structure in which the ventilation path is divided into several paths so as to correspond to the grouped structure in the disk array apparatus 1 according to the fourth embodiment. In the disk array apparatus 1, the RAID group (group to be a unit of the RAID control) can be configured and set for the physical HDD 200 group. In the fourth embodiment, the control function to the exhaust fan 35 is provided, and also, the control for the exhaust fan 35 and the RAID group of the HDD 200 are correlated in the management and control thereof. Also, in the fourth embodiment, the ventilation path is divided so as to correspond to the RAID groups in consideration of the ventilation path in the entire apparatus 1.

In FIG. 9, the configuration information of the HDD 200 groups of the groups G#1 to G#4 is set and managed so as to correspond to the RAID groups. FIG. 9 and FIG. 10 corresponds to each other in group configuration.

FIG. 10A is a diagram of a chassis seen from an upper face (50c) of the chassis, and FIG. 10B is a diagram of the chassis seen from a side thereof. In FIG. 10A, a rectangular area on the upper face (50c) of the chassis is divided into eight areas corresponding to eight ventilation fans 35, and an area corresponding to the central duct 31 is divided into eight areas by partitions 91. More specifically, eight ventilation paths for each of the groups are provided.

In FIG. 10B, the partition 91 extends in the vertical direction and divides the area in the central duct 31 into 8 areas so as to separate the groups (G#1 to G#4). In other words, the entire ventilation path is divided into several paths. Arrows in FIG. 10B represent the ventilation paths.

The exhaust fans 35 provided in the exhaust fan section (150) can be optionally provided so as to correspond to the above-described structure in which the ventilation path is divided. More specifically, the number of exhaust fans 35 to be mounted can be increased and decreased according to need such as required function. When only a required number of exhaust fans 35 are mounted based on the mounting in units of groups, the power consumption and the cost can be reduced. The arrows a and b represent the direction in which the additional exhaust fans 35 and corresponding groups are provided, and the groups are additionally provided in the order of G#1, G#2 . . . from the front and rear sides of the HDD box 10.

Also, in the structure in which the exhaust fan can be optionally provided, a mechanism such as a shutter can be provided to the place where the exhaust fan 35 is not mounted so as to shut the space. By doing so, the wasteful flow of the exhaust air between the mounting portion of the exhaust fan 35 and the portion in which the fan is not mounted can be reduced and prevented, and the more efficient exhaust can be performed in the entire apparatus.

According to the fourth embodiment, owing to the structure in which the ventilation path is divided into several paths so as to correspond to the grouped structure, the low-cost and efficient cooling function can be realized.

In the foregoing, the invention made by the inventors of the present invention has been concretely described based on the embodiments. However, it is needless to say that the present invention is not limited to the foregoing embodiments and various modifications and alterations can be made within the scope of the present invention. In the embodiments described above, the HDD module 20 and the HDD box 10 are main objects to be cooled. However, the object to be cooled is not limited to them. For example, components having a similar heating element (IC board or the like) such as modules constituting the control system (DKC 110) can be cooled in the same manner. Furthermore, storage device other than the HDD 200 can be employed as the storage devices to be mounted in the disk array apparatus 1, and the structure of the storage device modules having the cooling fan 24 built therein is modified in accordance with the structure of the storage device to be mounted. Also, the fans operated by the main power supply of the apparatus are disposed only in the upper part of the chassis in the embodiments described above. However, the fans can be additionally disposed in other parts of the chassis, for example, on the rear side of the HDD box 10 and in the middle of the central duct 31 so as to enhance the cooling performance. Furthermore, in the second embodiment, the exhaust fan 35 is controlled by the control board 60 (FSW) in front of the HDD 200 group. However, it is possible to perform the control by any other components and processors as long as the temperature and the data access can be detected.

The present invention can be applied to a disk array apparatus having heating elements such as HDDs and requiring a cooling structure.

What is claimed is:

1. A disk array apparatus having a function to control a storage device,
   wherein a storage device module having said storage device stored therein is mounted in a chassis of the disk array apparatus,
   said storage device module has a thermoelectric conversion device electrically connected to an air blower disposed inside of said storage device module,
   said thermoelectric conversion device converts heat of said storage device into electric power to supply it to said air blower,
   said air blower is automatically operated by the power supplied by said thermoelectric device to air-cool said storage device and exhaust the air to outside of said storage device module, wherein a sensor for detecting a temperature state around said storage device is provided, and
   a rotation speed of an exhaust fan in the upper part of said chassis is controlled based on said temperature state.

2. The disk array apparatus according to claim 1,
   wherein, in said storage device module, said thermoelectric conversion device is made of a material which generates an electric power by a temperature difference between a high-temperature portion and a low-temperature portion thereof,
   said air blower has a fan automatically operated by the power supply of said thermoelectric conversion device and an air duct which is disposed near said storage device so as to cover said fan or to be connected to said fan and directs the exhaust air from said fan to a rear face side of said storage device module, and
   air is taken from a front face side of said storage device module and is exhausted to the rear face side of said storage device module.

3. The disk array apparatus according to claim 2,
   wherein, in said storage device module, said storage device includes a disk portion having hardware which drives a disk and a board portion having a circuit board which controls the drive of said disk portion,
   the high-temperature portion of said thermoelectric conversion device is disposed near the board portion side of said storage device of said storage device module,
   said air duct is disposed near the disk portion side of said storage device of said storage device module, and
   said disk portion is air-cooled by the exhaust air in said air duct.

4. The disk array apparatus according to claim 2, wherein:
   said storage device module is one of a plurality of storage device modules,
   a rear board for electrically connecting said plurality of storage device modules to a main body is provided, and
   said rear board has, for each of said storage device modules, a connector for connecting said storage device, an exhaust hole provided at a corresponding position of the exhaust air from said air duct, and a linear signal wiring pattern between said connectors.

5. The disk array apparatus according to claim 2, wherein, in said storage device module, said storage device includes a disk portion having hardware which drives a disk and a board portion having a circuit board which controls the drive of said disk portion, said thermoelectric conversion device has a plate-like shape including a first flat portion to be said high-temperature portion and a second flat portion to be said low-temperature portion, and the first flat portion of said thermoelectric conversion device is disposed near the board portion of said storage device, and the second flat portion of said thermoelectric conversion device is disposed in front of the front face of said storage device.

6. The disk array apparatus according to claim 5, wherein said storage device module has an almost rectangular parallelepiped shape, and said fan is disposed between the front face of said storage device and the second flat portion of said thermoelectric conversion device.

7. The disk array apparatus according to claim 1, wherein air holes are formed in a front face and/or rear face and an upper face of said chassis, said storage device module is one of a plurality of storage device modules which are disposed on a front face side and/or rear face side of said chassis, exhaust fans operated by main power supply of the apparatus are disposed in an upper part of said chassis, and based on an operation of said exhaust fans, air is taken from the front face side and/or rear face side of said chassis, the air is exhausted to the rear face side through said storage device modules, and then exhausted to outside of said chassis via a duct vertically extending in the center of said chassis through said exhaust fans in the upper part of the chassis.

8. The disk array apparatus according to claim 7, wherein one or more storage device boxes having a structure in which said plurality of storage device modules are detachably mounted and air flows from a front side to a rear side thereof are provided in said chassis, and based on an operation of said exhaust fans, air is taken from the front side of said storage device box, the air is exhausted to the rear face side of said storage device box through said storage device modules, and the exhaust air from the rear face side of said storage device box is exhausted to outside of said chassis via a duct vertically extending in the center of said chassis through said exhaust fans in the upper part of the chassis.

9. The disk array apparatus according to claim 1, wherein:
said storage device module is one of a plurality of storage device modules,
the number of exhaust fans provided in the upper part of said chassis can be increased and decreased according to need,
the ventilation path including a duct vertically extending in the center of said chassis from the rear face side of said storage device modules is divided into several paths by partitions,
said plurality of storage device modules, said exhaust fan, and said divided ventilation path are grouped and managed based on the group, and the number of exhaust fans can be increased and decreased so as to correspond to the increase and decrease of the number of said storage device modules based on said group.

10. A disk array apparatus having a function to control a storage device,
wherein a storage device module having said storage device stored therein is mounted in a chassis of the disk array apparatus,
said storage device module has a thermoelectric conversion device electrically connected to an air blower disposed inside of said storage device module,
said thermoelectric conversion device converts heat of said storage device into electric power to supply it to said air blower,
said air blower is a structure automatically operated by the power supplied by said thermoelectric conversion device to air-cool said storage device and exhaust the air to outside of said storage device module,
an exhaust fan operated by main power supply of the apparatus is provided in the upper part of said chassis, and
a sensor for detecting a temperature state of said storage device is provided and a rotation speed of the exhaust fan in the upper part of said chassis is controlled based on said temperature state.

11. The disk array apparatus according to claim 10, wherein an access to said storage device is detected, and the rotation of said exhaust fan in the upper part of said chassis is controlled based on said access state.

12. The disk array apparatus according to claim 10, wherein a plurality of said exhaust fans are provided in the upper part of said chassis,
said storage device module is one of a plurality of storage device modules,
said plurality of storage device modules and said exhaust fan in the upper part are grouped and managed based on the group, and
the rotation of said exhaust fan is controlled based on said group.

13. The disk array apparatus according to claim 10, wherein:
said storage device module is one of a plurality of storage device modules,
a control board controlling said plurality of storage device modules is provided, and
said control board controls the rotation of said exhaust fan by controlling voltage to be applied to said exhaust fan.

14. A disk array apparatus having a function to control a plurality of HDD (Hard Disk Drives),
wherein for each of said HDDs:
a HDD module with an almost rectangular parallelepiped shape having said HDD stored therein is mounted in a chassis of the disk array apparatus,
said HDD module includes a thermoelectric conversion device electrically connected to a fan, and an air duct disposed near said HDD,
said thermoelectric conversion device converts heat of said HDD into electric power by a temperature difference between a high-temperature portion and a low-temperature portion thereof and supplies the power to said fan, said high-temperature portion is disposed near the board portion side of said HDD, and said low-temperature portion is disposed in front of the front face of said HDD,
said fan is disposed between the front face of said HDD and the low-temperature portion of said thermoelectric conversion device, and said fan is automatically operated by the power supplied by said thermoelectric conversion device to exhaust the air into said air duct, said air duct is disposed near the disk portion side of said HDD, and provided so as to cover said fan or to be connected to said fan and directs the exhaust air from said fan to the rear side of said HDD module, and air holes are formed in front and rear faces and an upper face of said chassis, and further wherein:

a plurality of exhaust fans operated by main power supply of the apparatus are provided in the upper part of said chassis, a plurality of HDD boxes having a structure in which said plurality of HDD modules are detachably mounted and air flows from a front side to a rear side thereof are provided on a front side and a rear side of said chassis, a rear board having a connector for connecting said plurality of HDD modules to rear sides of said HDD boxes and exhaust holes are provided, said HDD modules are respectively stored in said HDD boxes and the connectors of said HDDs are respectively connected to the connectors of said rear board, based on an operation of said exhaust fans, air is taken from the front and rear sides of said chassis, the air is exhausted to the rear sides of said HDD modules and HDD boxes through said HDD modules in said HDD boxes by the air flow by said fan and exhaust air in said air duct while air-cooling the disk portion of said HDDs, and the exhaust air is exhausted to outside of said chassis via a duct vertically extending in the center of said chassis through said exhaust fans in the upper part of the chassis, a sensor for detecting a temperature state around said HDD is provided, and a rotation speed of said exhaust fans is controlled based on said temperature state.

* * * * *